US012677473B2

(12) United States Patent
Hsieh et al.

(10) Patent No.: US 12,677,473 B2
(45) Date of Patent: Jul. 7, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventors: Po-Kuang Hsieh, Kaohsiung City (TW); Chien-Ting Lin, Tainan City (TW); Ssu-I Fu, Kaohsiung City (TW); Chin-Hung Chen, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 384 days.

(21) Appl. No.: 18/220,803

(22) Filed: Jul. 11, 2023

(65) Prior Publication Data

US 2024/0413015 A1     Dec. 12, 2024

(30) Foreign Application Priority Data

Jun. 12, 2023     (TW) ................................. 112121801

(51) Int. Cl.
H10D 84/03 (2025.01)
H10D 84/01 (2026.01)
H10D 84/84 (2025.01)

(52) U.S. Cl.
CPC ....... H10D 84/038 (2025.01); H10D 84/0135 (2025.01); H10D 84/84 (2025.01)

(58) Field of Classification Search
CPC .. H10D 84/038; H10D 84/0135; H10D 84/84; H10D 84/0142; H10D 84/0144; H10D 84/83
See application file for complete search history.

(56) References Cited

U.S. PATENT DOCUMENTS

2023/0077888 A1     3/2023   Kim et al.
2023/0260994 A1*    8/2023   Jong .................. H10D 84/8312
* cited by examiner

*Primary Examiner* — Mohammad A Rahman
(74) *Attorney, Agent, or Firm* — Winston Hsu

(57)     ABSTRACT

A method for fabricating a semiconductor device includes the steps of providing a substrate having a low-voltage (LV) region and a medium-voltage (MV) region, forming a first metal gate on the LV region and a second metal gate on the MV region, forming a first patterned mask on the second metal gate, removing part of the first metal gate, forming a second patterned mask on the first metal gate, removing part of the second metal gate, and then forming a first hard mask on the first metal gate and a second hard mask on the second metal gate.

8 Claims, 9 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of adjusting thickness of hard mask directly on top of the gate structures on low-voltage (LV) region and medium-voltage (MV) region.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of high-voltage devices and FinFET devices start to face numerous challenges such as current leakage and control of breakdown voltage. Hence, how to improve the current fabrication for improving performance of the device has become an important task in this field.

SUMMARY OF THE INVENTION

According to an embodiment of the present invention, a method for fabricating a semiconductor device includes the steps of providing a substrate having a low-voltage (LV) region and a medium-voltage (MV) region, forming a first metal gate on the LV region and a second metal gate on the MV region, forming a first patterned mask on the second metal gate, removing part of the first metal gate, forming a second patterned mask on the first metal gate, removing part of the second metal gate, and then forming a first hard mask on the first metal gate and a second hard mask on the second metal gate.

According to another aspect of the present invention, a semiconductor device includes a substrate having a medium-voltage (MV) region and a low-voltage (LV) region, a first gate structure on the LV region and a second gate structure on the MV region, and a first hard mask on the first gate structure and a second hard mask on the second gate structure. Preferably, the first hard mask and the second hard mask have different thicknesses.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
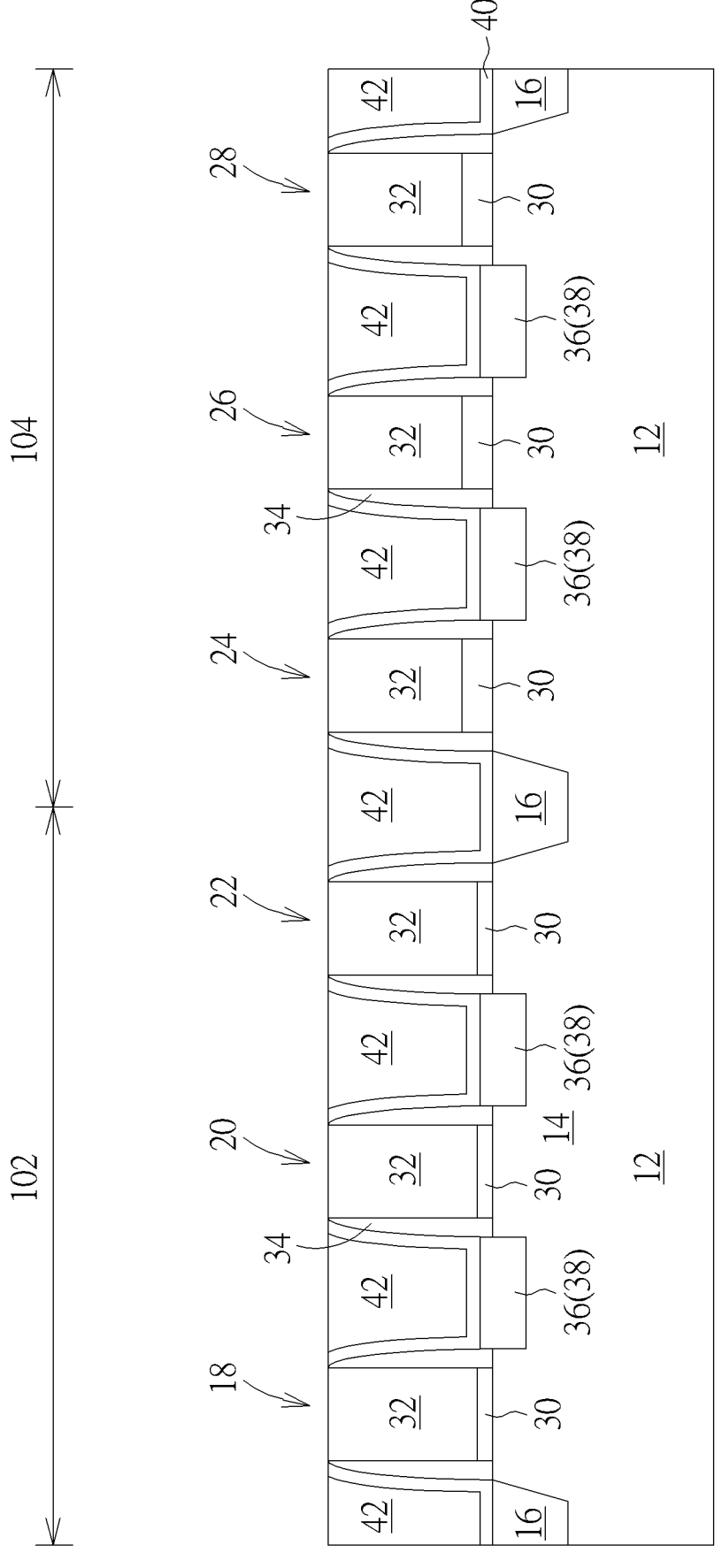
FIGS. 1-8 illustrate a method for fabricating a semiconductor device according to an embodiment of the present invention.

Referring to FIGS. 1-8, FIGS. 1-8 illustrate a method for fabricating a semiconductor device according to an embodiment of the present invention. As shown in FIG. 1, a substrate 12, such as a silicon substrate or silicon-on-insulator (SOI) substrate is first provided and a LV region 102 and a MV region 104 are defined on the substrate 12, in which the surface of the substrate 12 on the LV region 102 is preferably even with the surface of the substrate 12 on the MV region 104. Next, fin-shaped structures 14 are formed on the substrate 12 of the LV region 102 while no fin-shaped structures are formed on the substrate 12 of the MV region 104. In other words, non-planar transistors such as FinFET transistors will be formed on the LV region 102 while planar transistors will be formed on the MV region 104.

Preferably, the fin-shaped structures 14 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate, 12, and through an etching process, the pattern of the patterned mask is transferred to the substrate 12 to form the fin-shaped structures 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structure are all within the scope of the present invention.

Next, a shallow trench isolation (STI) 16 is formed around the fin-shaped structures 14 to divide the LV region 102 and the MV region 104. In this embodiment, the formation of the STI 16 could be accomplished by conducting a flowable chemical vapor deposition (FCVD) process to form a silicon oxide layer on the substrate 12 and covering the fin-shaped structures 14 entirely. Next, a chemical mechanical polishing (CMP) process along with an optional etching process are conducted to remove part of the silicon oxide layer so that the top surface of the remaining silicon oxide is slightly lower than or even with the top surface of the fin-shaped structures 14 for forming the STI 16.

Next, gates structures 18, 20, 22, 24, 26, 28 or dummy gates are formed on the substrate 12 on both the LV region 102 and MV region 104. In this embodiment, the formation of the gate structures 18, 20, 22, 24, 26, 28 could be accomplished by a gate first process, a high-k first approach from gate last process, or a high-k last approach from gate last process. Since this embodiment pertains to a high-k last approach, a gate dielectric layer 30 or interfacial layer, a gate material layer 32 made of polysilicon, and a selective hard mask (not shown) could be formed sequentially on the substrate 12, and a photo-etching process is then conducted by using a patterned resist (not shown) as mask to remove part of the gate material layer 32 and part of the gate dielectric layer 30 through single or multiple etching processes. After stripping the patterned resist, gate structures 18, 20, 22, 24, 26, 28 each composed of a patterned gate dielectric layer 30 and a patterned material layer 32 are formed on the substrate 12.

It should be noted that since the LV device and MV device typically required different voltage during operation, the gate structures 18, 20, 22 on the LV region 102 and the gate structures 24, 26, 28 on the MV region 104 are preferably fabricated on different stage of the fabrication process. Preferably, the gate dielectric layer 30 on the LV region 102 and the gate dielectric layer 30 on the MV region 104 preferably have different thicknesses. For instance, the thickness of the gate dielectric layer 30 on the LV region 102 is less than the thickness of the gate dielectric layer 30 on the MV region 104.

Next, at least a spacer 34 is formed on the sidewalls of the each of the gate structures 18, 20, 22, 24, 26, 28, a source/drain region 36 and/or epitaxial layer 38 is formed in the fin-shaped structures 14 and/or substrate 12 adjacent to two sides of the spacer 34, and selective silicide layers (not shown) could be formed on the surface of the source/drain regions 36. It should be noted that since the source/drain regions 36 are formed in the substrate 12 adjacent to two sides of the gate structure 20 on the LV region 102 and the gate structure 26 on the MV region 104, only the gate structures 20, 26 are active gate structures while the remaining gate structures 18, 22, 24, 28 are dummy gate structures.

In this embodiment, the spacer 34 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example SiO$_2$, SiN, SiON, SiCN, or combination thereof. The source/drain regions 36 could include n-type dopants or p-type dopants depending on the type of device being fabricated.

In this embodiment, the epitaxial layers 38 could also be formed to include different materials depending on the type of transistor being fabricated. For instance, if the MOS transistor being fabricated were to be a PMOS transistor, the epitaxial layers 38 could be made of material including but not limited to for example SiGe, SiGeB, or SiGeSn. If the MOS transistor being fabricated were to be a NMOS transistor, the epitaxial layers 38 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 38 are preferred to have less or no germanium atom at all to facilitate the formation of silicide afterwards.

According to an embodiment of the present invention, it would also be desirable to form source/drain regions 36 in part or all of the epitaxial layers 38. According to another embodiment of the present invention, the source/drain regions 36 could also be formed insituly during the SEG process. For instance, the source/drain regions 36 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain regions 36. Moreover, the dopants within the source/drain regions 36 could also be formed with a gradient, which is also within the scope of the present invention.

Next, a contact etch stop layer (CESL) 40 is formed on the gate structures 18, 20, 22, 24, 26, 28 and the STI 16, and an interlayer dielectric (ILD) layer 42 is formed on the CESL 40. Next, a planarizing process such as CMP is conducted to remove part of the ILD layer 42 and part of the CESL 40 for exposing the gate material layer 32 made of polysilicon so that the top surface of the gate material layer 32 is even with the top surface of the ILD layer 42.

Figure 2:
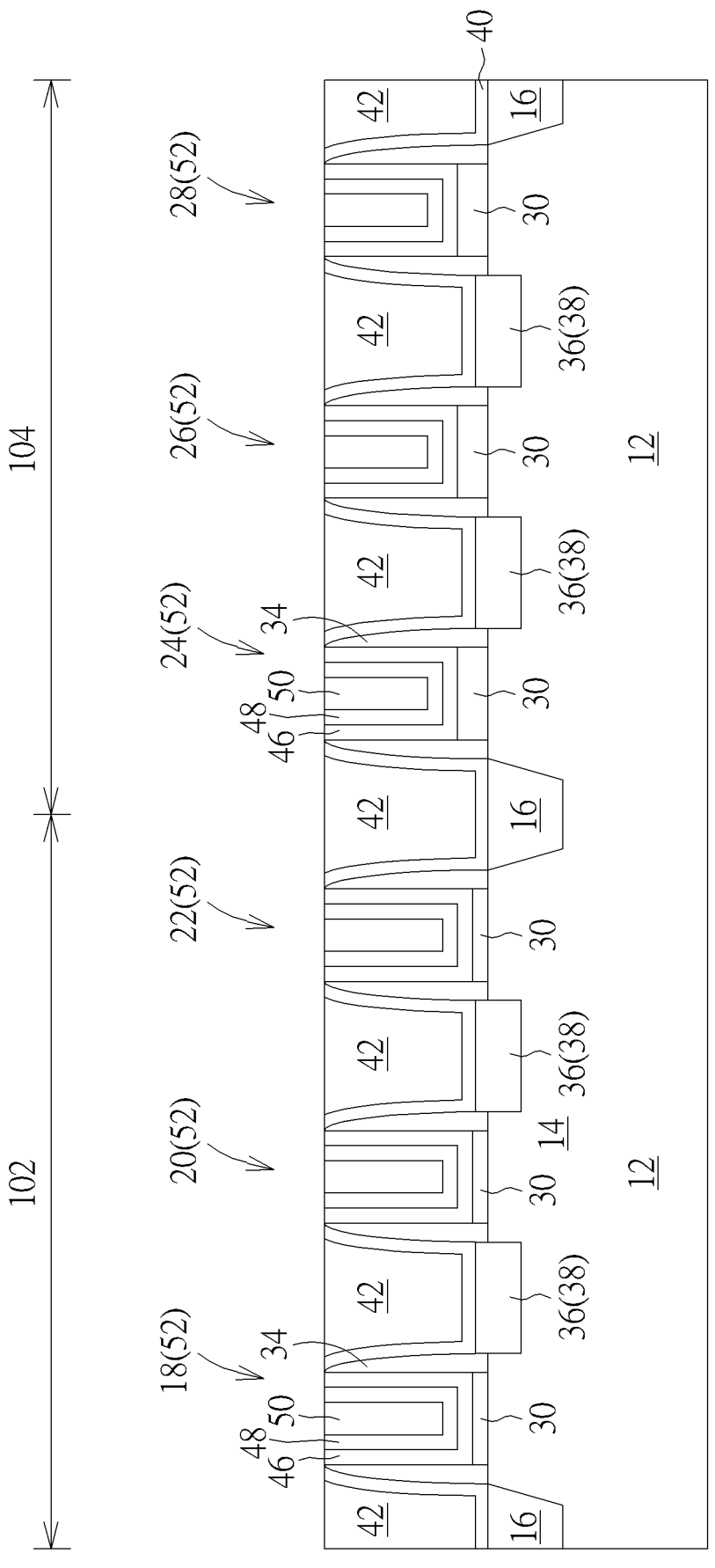

Next, as shown in FIG. 2, a replacement metal gate (RMG) process is conducted to transform the gate structures 18, 20, 22, 24, 26, 28 on the LV region 102 and MV region 104 into metal gates. For instance, the RMG process could be accomplished by first performing a selective dry etching or wet etching process using etchants including but not limited to for example ammonium hydroxide (NH$_4$OH) or tetramethylammonium hydroxide (TMAH) to remove the gate material layer 32 and even gate dielectric layer 30 from each of the gate structures 18, 20, 22, 24, 26, 28 for forming recesses (not shown) in the ILD layer 42.

Next, a selective interfacial layer (not shown) or gate dielectric layer, a high-k dielectric layer 46, a work function metal layer 48, and a low resistance metal layer 50 are formed in the recesses, and a planarizing process such as CMP is conducted to remove part of low resistance metal layer 50, part of work function metal layer 48, and part of high-k dielectric layer 46 to form metal gates 52. In this embodiment, the gate structures or metal gates 52 fabricated through high-k last process of a gate last process preferably includes an interfacial layer or gate dielectric layer 30, a U-shaped high-k dielectric layer 46, a U-shaped work function metal layer 48, and a low resistance metal layer 50.

In this embodiment, the high-k dielectric layer 46 is preferably selected from dielectric materials having dielectric constant (k value) larger than 4. For instance, the high-k dielectric layer 50 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate $(SrBi_2Ta_2O_9$, SBT), lead zirconate titanate $(PbZr_xTi_{1-x}O_3$, PZT), barium strontium titanate $(Ba_xSr_{1-x}TiO_3$, BST) or a combination thereof.

In this embodiment, the work function metal layer 48 is formed for tuning the work function of the metal gate in accordance with the conductivity of the device. For an NMOS transistor, the work function metal layer 48 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 48 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 48 and the low resistance metal layer 50, in which the material of the barrier layer may include titanium (Ti), titanium nitride (TiN), tantalum (Ta) or tantalum nitride (TaN). Furthermore, the material of the low-resistance metal layer 50 may include copper (Cu), aluminum (Al), titanium aluminum (TiAl), cobalt tungsten phosphide (CoWP) or any combination thereof.

Figure 3:
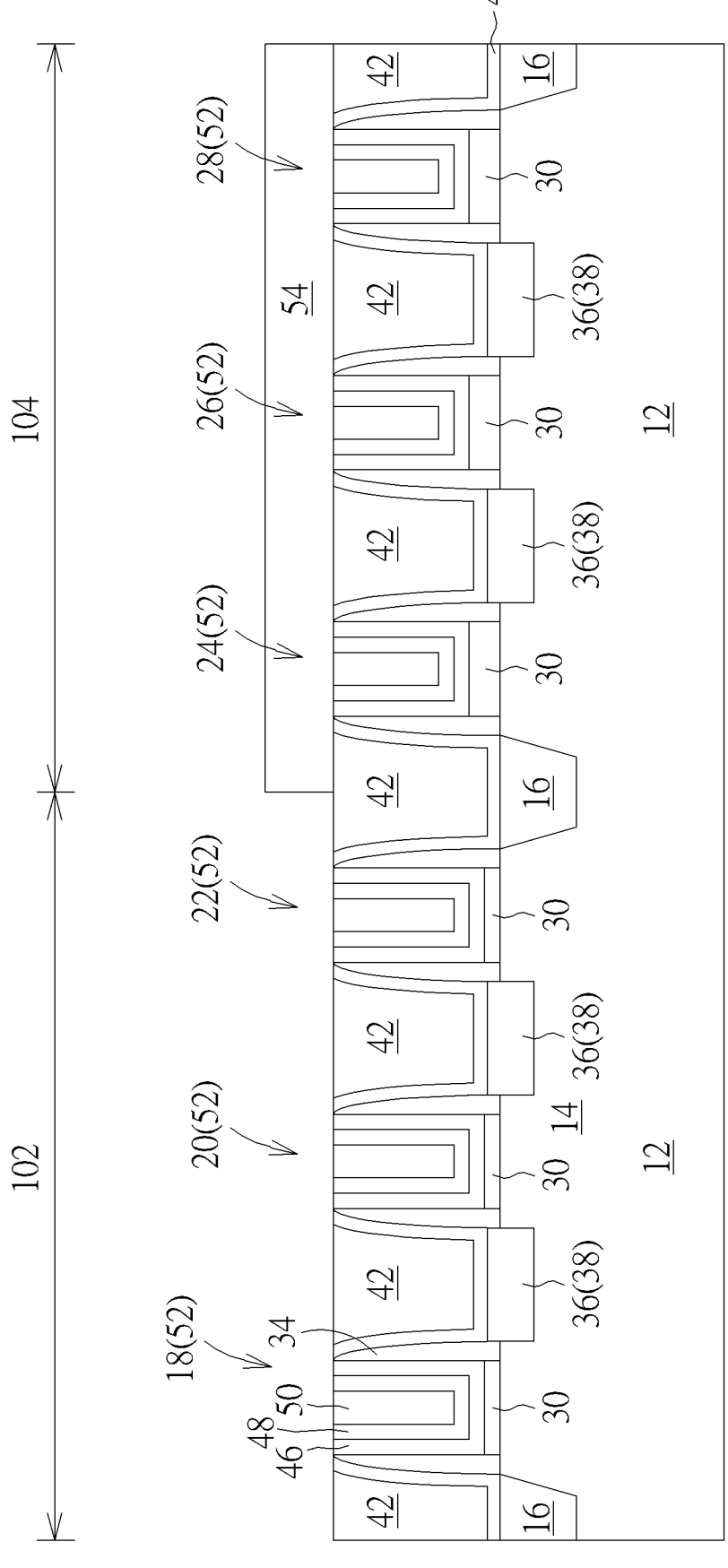

Next, as shown in FIG. 3, a patterned mask 54 such as a patterned resist is formed on the metal gates 52 and ILD layer 42 on the MV region 104 and exposing the surface of the metal gates 52 and ILD layer 42 on the LV region 102.

Figure 4:
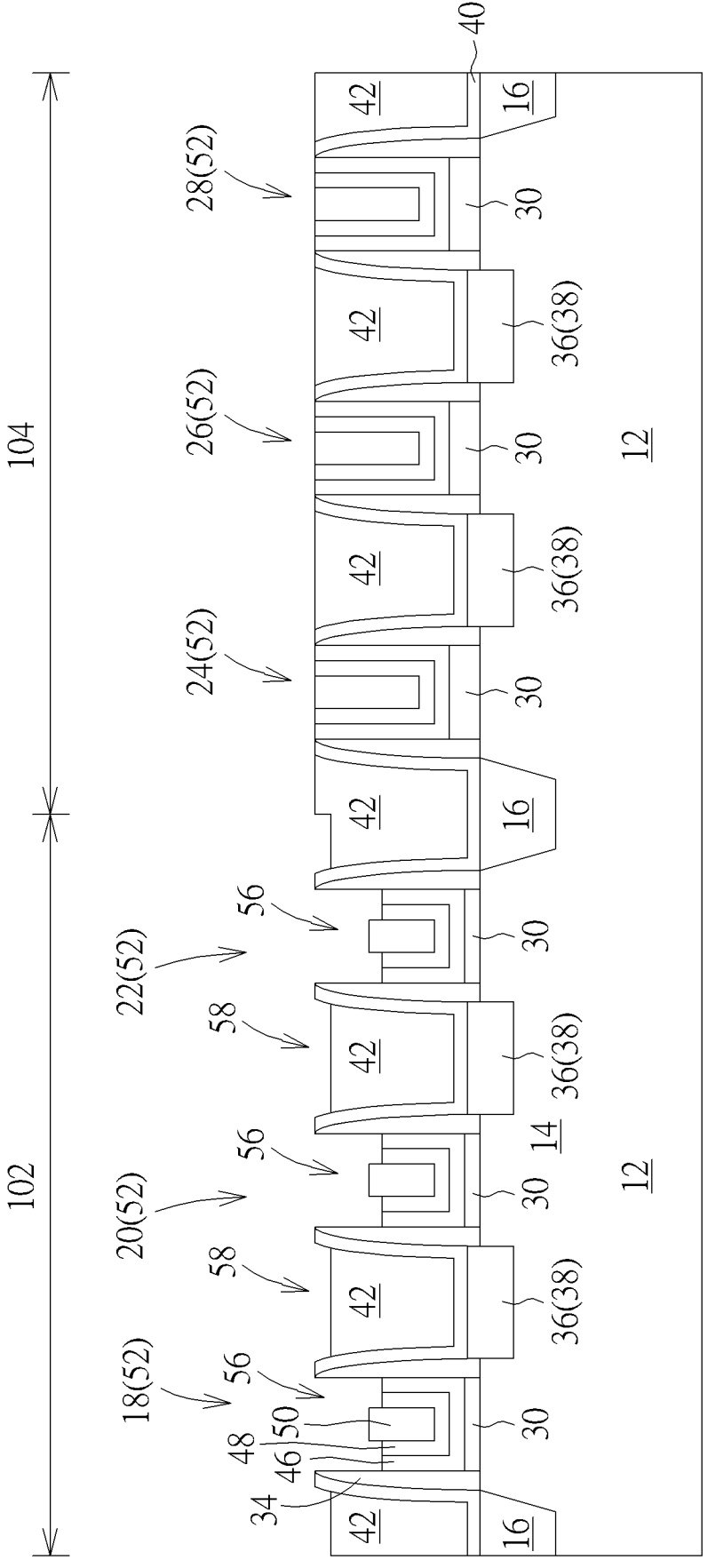

Next, as shown in FIG. 4, an etching process is conducted by using the patterned mask 54 as mask to remove part of the metal gates 52 and even part of the ILD layer 42 on the LV region 102, and the patterned mask 54 is removed thereafter. Specifically, the etching process conducted at this stage preferably removes part of the high-k dielectric layer 46, part of the work function metal layer 48, and part of the low resistance metal layer 50 from the metal gates 52 on LV region 102 and even part of the ILD layer 42 around the metal gates 52. This forms recesses 56 directly on top of the remaining metal gates 52 and recesses 58 in the ILD layer 42 adjacent to the metal gates 52.

In this embodiment, the bottom surface of the recesses 56 directly on top of the metal gates 52 is slightly lower than the bottom surface of the recesses 58 in the ILD layer 42, and as part of the metal gates 52 are removed it would be desirable to remove more of the high-k dielectric layer 46 and work function metal layer 48 and less of the low resistance metal layer 50 so that the top surface of the remaining low resistance metal layer 50 is slightly higher than the top surface of the remaining high-k dielectric layer 46 and work function metal layer 48. According to an embodiment of the present invention, the depth of the recess 56 directly atop the metal gates 52 on LV region 102 is between 350-400 Angstroms or most preferably 380 Angstroms and the depth of the recess 58 in the ILD layer 42 is between 50-70 Angstroms or most preferably 60 Angstroms.

Figure 5:

Next, as shown in FIG. 5, another patterned mask 60 such as a patterned resist is formed on the metal gates 52 and ILD layer 42 on the LV region 102 and exposing the surface of the metal gates 52 and ILD layer 42 on the MV region 104.

Figure 6:
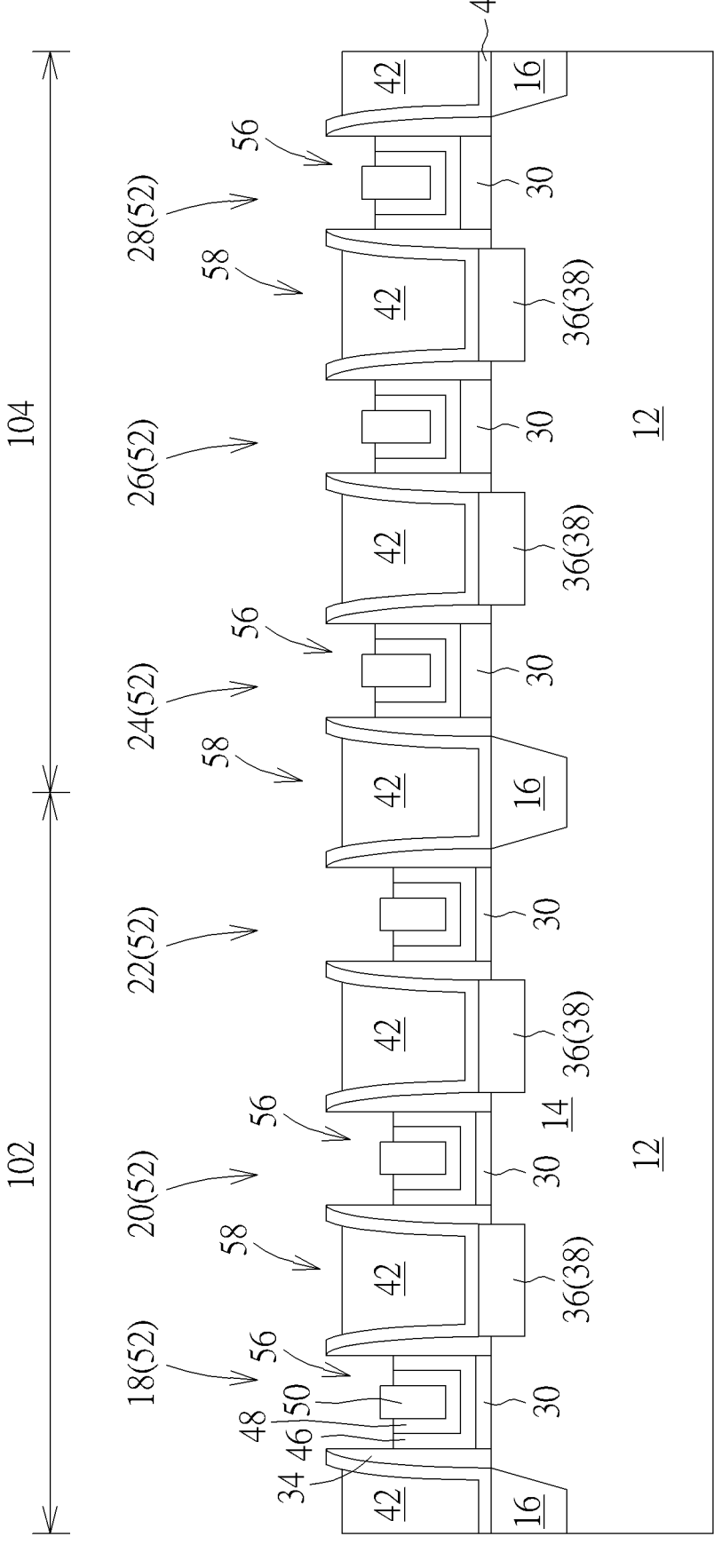

Next, as shown in FIG. 6, an etching process is conducted by using the patterned mask 60 as mask to remove part of the metal gates 52 and even part of the ILD layer 42 on the MV region 104, and the patterned mask 60 is removed thereafter. Similar to the aforementioned approach for remove metal gates 52 on the LV region 102, the etching process conducted at this stage preferably removes part of the high-k dielectric layer 46, part of the work function metal layer 48, and part of the low resistance metal layer 50 from the metal gates 52 on the MV region 104 and even part of the ILD layer 42 around the metal gates 52. This forms recesses 56 directly on top of the remaining metal gates 52 and recesses 58 in the ILD layer 42 adjacent to the metal gates 52.

In this embodiment, the bottom surface of the recesses 56 directly on top of the metal gates 52 on MV region 104 is slightly lower than the bottom surface of the recesses 58 in the ILD layer 42, and as part of the metal gates 52 are removed it would be desirable to remove more of the high-k dielectric layer 46 and work function metal layer 48 and less of the low resistance metal layer 50 so that the top surface of the remaining low resistance metal layer 50 is slightly higher than the top surface of the remaining high-k dielectric layer 46 and work function metal layer 48.

According to an embodiment of the present invention, the depth of the recess 56 directly atop the metal gates 52 on MV region 104 is between 150-200 Angstroms or most preferably 180 Angstroms and the depth of the recess 58 in the ILD layer 42 on MV region 104 is between 50-70 Angstroms or most preferably 60 Angstroms. In other words, the depth of the recesses 56 directly atop the metal gates 52 on MV region 104 is slightly less than the depth of the recesses 56 directly atop the metal gates 52 on LV region 102 at this stage or the bottom surface of the recesses 56 directly atop the metal gate 52 on MV region 104 is slightly higher than the bottom surface of the recesses 56 directly atop the metal gates 52 on the LV region 102.

Figure 7:
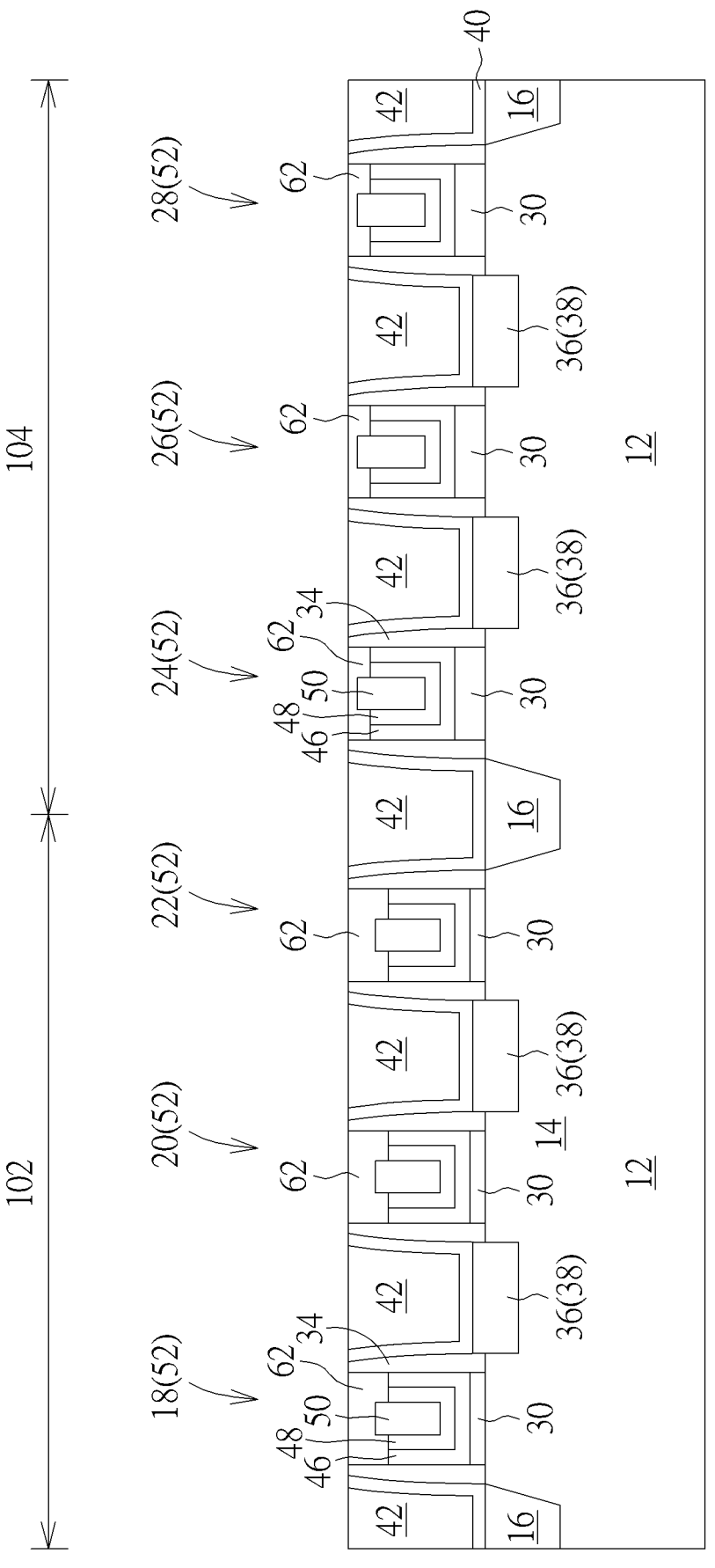

Next, as shown in FIG. 7, a hard mask 62 is formed in the recesses 56, 58 on the LV region 102 and MV region 104 to fill the recesses 56, 58 completely, and then a planarizing process such as CMP is conducted to remove part of the hard mask 62 including part of the hard mask 62 directly atop of each gate structure and all of the hard mask 62 in the ILD layer 42 so that the top surface of the remaining hard mask 62 is even with the top surface of the ILD layer 42. It should be noted that since the depth of the recesses 56 on the MV region 104 is less than the depth of the recesses 56 on the LV region 102, after filling the hard mask 52 the thickness of the hard mask 62 on the MV region 104 would also be preferably less than the thickness of the hard mask 62 on the LV region 102. In this embodiment, the hard mask 62 could include $SiO_2$, SiN, SiON, SiCN, or combination thereof.

Specifically, since the aforementioned CMP process preferably removes approximately 150 Angstroms of the hard mask 62 on the LV region 102 and the MV region 104, the thickness of the remaining hard mask 62 directly on top of the metal gates 52 on the LV region 102 is between 200-250 Angstroms or most preferably 230 Angstroms while the thickness of the remaining hard mask 62 directly on top of the metal gates 52 on the MV region 104 is between 10-60 Angstroms or most preferably 30 Angstroms.

Figure 8:
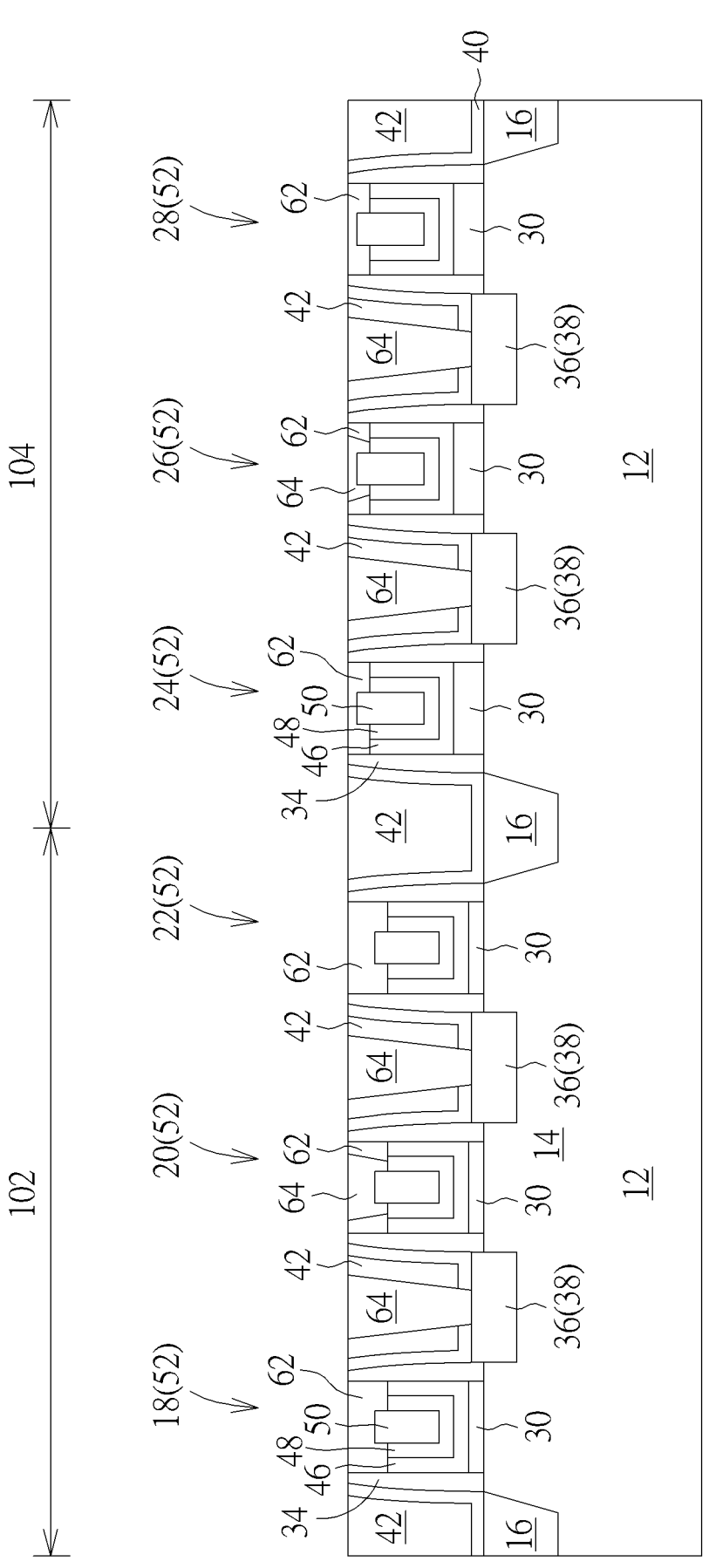

Next, as shown in FIG. 8, a photo-etching process is conducted by using a patterned mask (not shown) as mask to remove part of the ILD layer 42 and part of the CESL 40 adjacent to the gate structures 18, 20, 22, 24, 26, 28 as well as part of the hard mask 62 directly on top of the gate structures 20, 26 for forming contact holes (not shown) exposing the source/drain regions 36 and top surface of the active gate structures 20, 26. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 64 electrically connecting the source/drain regions 36 and the active gate structures 20, 26. This completes the fabrication of a semiconductor device according to an embodiment of the present invention.

Figure 9:
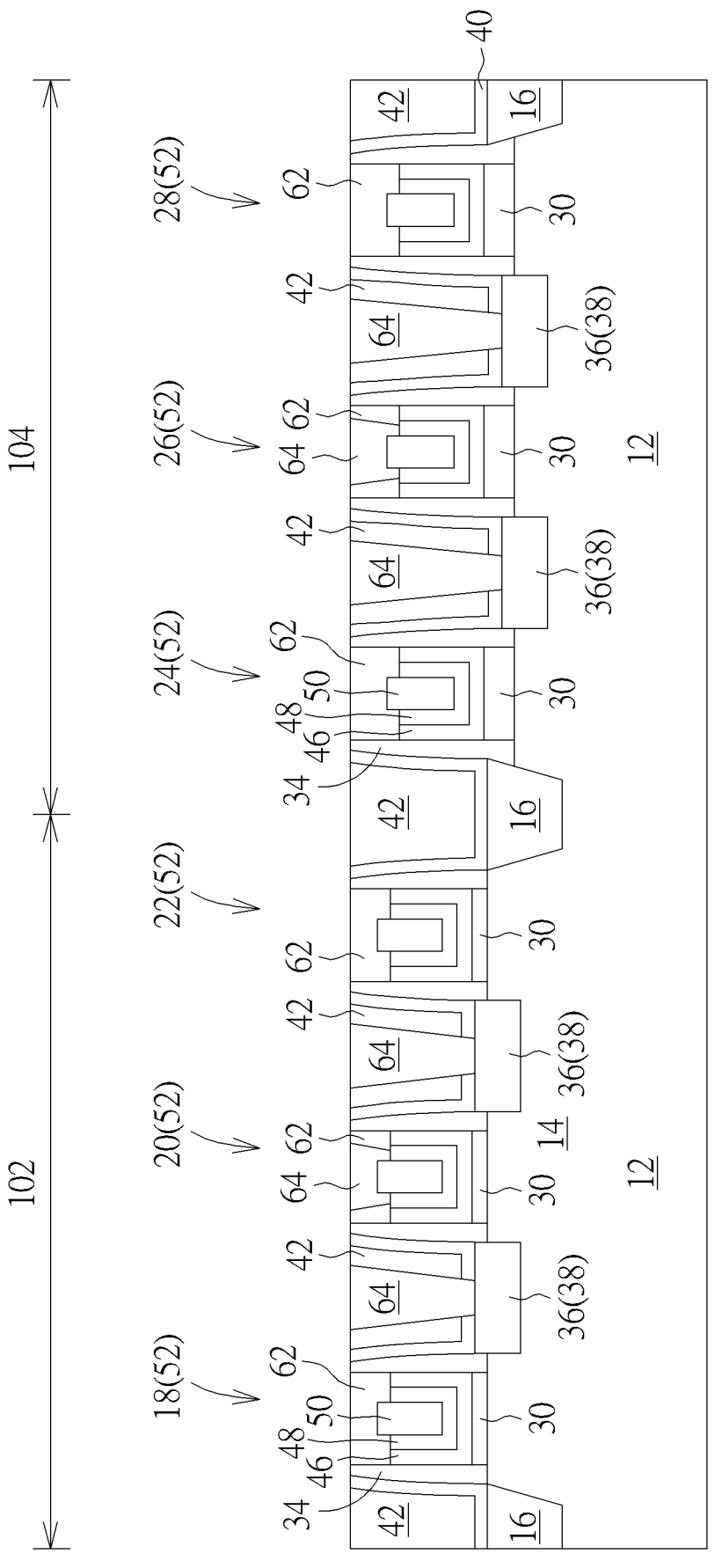
FIG. 9 illustrates a structural view of a semiconductor device according to an embodiment of the present invention.

Referring to FIG. 9, FIG. 9 illustrates a structural view of a semiconductor device according to an embodiment of the present invention. As shown in FIG. 9, the semiconductor device includes at least a gate structure 20 disposed on the LV region 102 and at least a gate structure 26 disposed on the MV region 104, a hard mask 62 disposed directly on top of the gate structure 20, and another hard mask 62 disposed directly on top of the gate structure 26. In contrast to the surface of the substrate 12 on LV region 102 being even with the surface of the substrate 12 on MV region 104 in the aforementioned embodiment, the surface of the substrate 12 on LV region 102 in this embodiment is slightly higher than the surface of the substrate 12 on MV region 104. Hence, the bottom surface of the metal gates 52 on the MV region 104 is slightly lower than the bottom surface of the metal gates 52 on the LV region 102.

Moreover, the hard mask 62 directly atop the gate structure 20 on LV region 102 and the hard mask 62 directly atop the gate structure 26 on MV region 104 preferably have different thicknesses while the top surfaces of the hard masks 62 on the LV region 102 and MV region 104 are coplanar. In contrast to the thickness of the hard mask 62 on MV region 104 being less than the thickness of the hard mask 62 on LV region 102 in the previous embodiment, the thickness of the hard mask 62 on MV region 104 in this embodiment is greater than the thickness of the hard mask 62 on LV region 102. Specifically, the thickness of the hard mask 62 directly on top of the metal gates 52 on LV region 102 is between 200-250 Angstroms or most preferably 230 Angstroms while the thickness of the hard mask 62 directly on top of the metal gates 52 on MV region 104 is between 400-450 Angstroms or most preferably 430 Angstroms.

Overall, the present invention discloses an approach of using photo-etching process to adjust the thickness of hard mask directly on top of the gate structures on the LV region and MV region. By doing so, issue such as overly large height difference on the MV region caused by loss of hard mask on the LV region could be minimized. According to an embodiment of the present invention, it would be desirable to first conduct a RMG process for transforming polysilicon gates on the LV region and MV region into metal gates, form a patterned mask 54 on the MV region, remove part of the metal gates on the LV region for forming recesses, remove the patterned mask 54, form another patterned mask 60 on the LV region, remove part of the metal gates on the MV region for forming recesses, remove the patterned mask 60, and then form hard masks 62 to fill the recesses on the LV region and MV region at the same time. Since the recesses on LV region and MV region have different depths, the hard masks filled into the recesses afterwards on LV region and MV region would also have different thicknesses. Moreover, despite the aforementioned embodiment discloses an approach of first removing part of the metal gates on the LV region and then removing part of the metal gates on the MV region, according to other embodiment of the present invention, it would also be desirable to alter the aforementioned order by first removing part of the metal gates on the MV region and then removing part of the metal gates on the LV region afterwards, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a medium-voltage (MV) region and a low-voltage (LV) region;
   a first gate structure on the LV region and a second gate structure on the MV region, wherein a bottom surface of the first gate structure is even with a bottom surface of the second gate structure; and
   a first hard mask on the first gate structure and a second hard mask on the second gate structure, wherein the first hard mask and the second hard mask comprise different thicknesses.

2. The semiconductor device of claim 1, wherein a surface of the substrate on the LV region is even with a surface of the substrate on the MV region.

3. The semiconductor device of claim 2, wherein a bottom surface of the first gate structure is even with a bottom surface of the second gate structure.

4. The semiconductor device of claim 2, wherein a thickness of the second hard mask is less than a thickness of the first hard mask.

5. The semiconductor device of claim 1, wherein a surface of the substrate on the LV region is higher than a surface of the substrate on the MV region.

6. The semiconductor device of claim 5, wherein a bottom surface of the first gate structure is higher than a bottom surface of the second gate structure.

7. The semiconductor device of claim 5, wherein a thickness of the first hard mask is less than a thickness of the second hard mask.

8. The semiconductor device of claim 1, wherein top surfaces of the first hard mask and the second hard mask are coplanar.

* * * * *